United States Patent
Nakagawa

(10) Patent No.: US 9,480,146 B2
(45) Date of Patent: Oct. 25, 2016

(54) WIRING BOARD

(71) Applicant: KYOCERA Circuit Solutions, Inc., Kyoto (JP)

(72) Inventor: Yoshihiro Nakagawa, Osaka (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/971,453

(22) Filed: Dec. 16, 2015

(65) Prior Publication Data

US 2016/0192475 A1 Jun. 30, 2016

(30) Foreign Application Priority Data

Dec. 27, 2014 (JP) ................................ 2014-266824

(51) Int. Cl.
*H05K 1/11* (2006.01)
*H05K 1/03* (2006.01)
*H05K 1/16* (2006.01)
*H05K 1/02* (2006.01)

(52) U.S. Cl.
CPC .......... *H05K 1/0245* (2013.01); *H05K 1/0298* (2013.01); *H05K 1/113* (2013.01)

(58) Field of Classification Search
CPC ... H05K 1/0298; H05K 1/113; H05K 1/0245
See application file for complete search history.

(56) References Cited

U.S. PATENT DOCUMENTS

| | | | |
|---|---|---|---|
| 2005/0057906 A1* | 3/2005 | Nakatani ................ | H05K 3/321 361/771 |
| 2010/0018761 A1* | 1/2010 | Wang .................. | H01L 23/5389 174/260 |
| 2010/0025081 A1* | 2/2010 | Arai .................. | H01L 23/49816 174/251 |
| 2010/0147574 A1* | 6/2010 | Kaneko ............... | H01L 21/4853 174/261 |
| 2012/0261166 A1* | 10/2012 | Oh ....................... | H05K 1/0206 174/252 |
| 2013/0194764 A1* | 8/2013 | Mikado ................. | H05K 1/185 361/761 |
| 2015/0000965 A1* | 1/2015 | Shiroshita ............. | H05K 1/113 174/257 |
| 2015/0009645 A1* | 1/2015 | Kaneko ................. | H05K 1/181 361/767 |

FOREIGN PATENT DOCUMENTS

JP 2014-082393 A 5/2014

* cited by examiner

*Primary Examiner* — Sherman Ng
(74) *Attorney, Agent, or Firm* — Volpe and Koenig, P.C.

(57) ABSTRACT

The wiring board in the present invention includes: an insulating board; external connection pads for a differential signal and external connection pads for grounding or a power supply formed on a lower surface of the insulating board; and a through-conductor formed in the insulating board. Each of the external connection pads is formed in a two-dimensional arrangement, a diameter and an arrangement pitch of the external connection pad for a differential signal are smaller than a diameter and an arrangement pitch of the external connection pad for grounding or a power supply, and an arrangement pitch of the through-conductor connected to the external connection pad for a differential signal is less than or equal to an arrangement pitch of the external connection pad for a differential signal.

5 Claims, 1 Drawing Sheet

WIRING BOARD

BACKGROUND OF THE INVENTION

1. Technical Field

The present invention relates to a wiring board for mounting a semiconductor element such as a semiconductor integrated circuit element.

2. Background

The conventional wiring board B for mounting the semiconductor element S' will be described with reference to FIG. 3. The wiring board B includes the insulating board 30 where a plurality of insulating layers 33 having a via hole 34 are laminated on the upper and lower surfaces of the insulating plate 31 having a through-hole 32. Such a wiring board is described, for example, in Japanese Unexamined Patent Application Publication No. 2014-82393.

A plurality of conductors 35a and 35b are arranged on the surface of and inside the insulating board 30. The conductor 35a is a conductor for a differential signal. The conductor 35b is a conductor for grounding or a power supply. Through-conductors 36a and 36b are deposited in the through-hole 32. The through-conductor 36a is a through-conductor for a differential signal. The through-conductor 36b is a through-conductor for grounding or a power supply.

Via-hole conductors 37a and 37b are filled in the via hole 34. The via-hole conductor 37a is a via-hole conductor for a differential signal. The via-hole conductor 37b is a via-hole conductor for grounding or a power supply.

A plurality of semiconductor element connection pads 38a and 38b are formed in the central portion of the upper surface of the insulating board 30. The semiconductor element connection pad 38a is a semiconductor element connection pad for a differential signal. The semiconductor element connection pad 38b is a semiconductor element connection pad for grounding or a power supply. The semiconductor element connection pads 38a and 38b are electrically connected to the electrodes of the semiconductor element S' through the solder.

External connection pads 39a and 39b are formed on the lower surface of the insulating board 30. The external connection pad 39a is an external connection pad for a differential signal. The external connection pad 39b is an external connection pad for grounding or a power supply. The external connection pads 39a and 39b are connected to the wiring conductors of the external electric circuit board through the solder.

Furthermore, a solder resist layer 40 is deposited on the surfaces of the insulating layer 33 and the conductors 35a and 35b of the outermost layer. The solder resist layer 40 on the upper surface side includes the opening exposing the central portion of the semiconductor element connection pads 38a and 38b. The solder resist layer 40 on the lower surface side includes the opening exposing the central portion of the external connection pads 39a and 39b.

The wiring board B includes a transmission path for a differential signal and a transmission path for grounding or a power supply. The transmission path for a differential signal connects the semiconductor element connection pad 38a and the external connection pad 39a to each other through the conductor 35a, the through-conductor 36a, and the via-hole conductor 37a. In the transmission path for a differential signal, a pair of transmission paths are disposed in such a manner as to be mutually adjacent. The through-conductor 36a and the via-hole conductor 37a are connected to the central portion of the external connection pad 39a. On the other hand, the transmission path for grounding or a power supply connects the semiconductor element connection pad 38b and the external connection pad 39b to each other through the conductor 35b, the through-conductor 36b, and the via-hole conductor 37b.

The differential signal is a transmission form having low electrical loss in the high-frequency transmission, and is useful as the form of transmitting a high-frequency signal. By the way, the wiring board B is designed so that its characteristic impedance comes as close as possible to 100Ω in the transmission path for a differential signal. It is preferred that the value of the impedance in each portion of the conductor 35a, the through-conductor 36a, or the via-hole conductor 37a constituting the transmission path for a differential signal is as close as possible to 100Ω, and that the difference in the impedance values in the transmission line is small. Thereby, the reflection of the signal is reduced, and the high-frequency signal can be transmitted efficiently.

In the wiring board B, the diameter of the external connection pads 39a and 39b is typically set to about 640 μm. The arrangement pitch between the adjacent external connection pads 39a and 39b is typically set to about 1 mm. The diameter of the external connection pads 39a and 39b is set as about 640 μm, and the connection area between the external connection pad and the wiring conductor of the external electric circuit board is increased, whereby the connection reliability between the wiring board B and the external electric circuit board is improved. The arrangement pitch between the external connection pads 39a and 39b is set as large as about 1 mm, whereby the electrical insulation reliability between the mutually adjacent external connection pads 39a and 39b is secured.

However, in the conventional wiring board B, the diameter of the external connection pads 39a and 39b is as large as about 640 μm, and therefore the electrostatic capacitance between the adjacent external connection pads 39a for a differential signal increases. For this reason, there is a tendency that the value of the impedance is less than 100Ω in the portion of these external connection pads 39a for a differential signal.

On the contrary, in the through-conductors 36a connected to the central portion of the external connection pads 39a for a differential signal, the arrangement pitch is as large as about 1 mm, and therefore there is a tendency that the electrostatic capacitance between the adjacent through-conductors 36a for a differential signal is reduced, and that the value of the impedance is greater than 100Ω. For this reason, there are problems that the impedance mismatch occurs, the reflection of the signal increases, and the high-frequency signal cannot be efficiently transmitted between the external connection pad 39a for a differential signal and the through-conductor 36a.

SUMMARY

The present invention has an object to provide a wiring board capable of reducing the reflection of the high-frequency signal, and capable of transmitting signals efficiently.

The wiring board according to an embodiment of the present invention includes: an insulating board; at least a pair of mutually adjacent external connection pads for a differential signal and a plurality of external connection pads for grounding or a power supply formed on a lower surface of the insulating board; and a through-conductor formed in the insulating board, electrically connected to each of the external connection pads. Each of the external connection pads is formed in a two-dimensional arrangement, a diameter and an arrangement pitch of the external connection pad for a differential signal are smaller than a diameter and an arrangement pitch of the external connection pad for grounding or a power supply, and an arrangement pitch of the through-conductor connected to the external connection pad for a differential signal is less than or equal to an arrangement pitch of the external connection pad for a differential signal.

According to the wiring board according to the embodiment of the present invention, the diameter and the arrangement pitch of the external connection pad for a differential signal are formed smaller than the diameter and the arrangement pitch of the external connection pad for grounding or a power supply. For this reason, the electrostatic capacitance between the adjacent external connection pads for a differential signal is reduced, whereby the value of the impedance can be increased to be closer to 100Ω. Furthermore, the arrangement pitch of the through-conductor connected to the external connection pad for a differential signal is less than or equal to the arrangement pitch of the external connection pad for a differential signal. For this reason, the electrostatic capacitance between the adjacent through-conductors for a differential signal is increased, whereby the value of the impedance can be decreased to be closer to 100Ω.

Therefore, the impedance mismatching is reduced and the reflection of the signal is decreased between the external connection pad for a differential signal and the through-conductor, whereby the wiring board capable of transmitting the high-frequency signal efficiently can be provided. The ratio of the number of the external connection pads for a differential signal to that of the external connection pads is about 10 to 20%, and therefore even when the diameter of the external connection pad for a differential signal is reduced, the impact on the connection reliability between the wiring board and the external electric circuit board is small.

DETAILED DESCRIPTION

Figure 1:
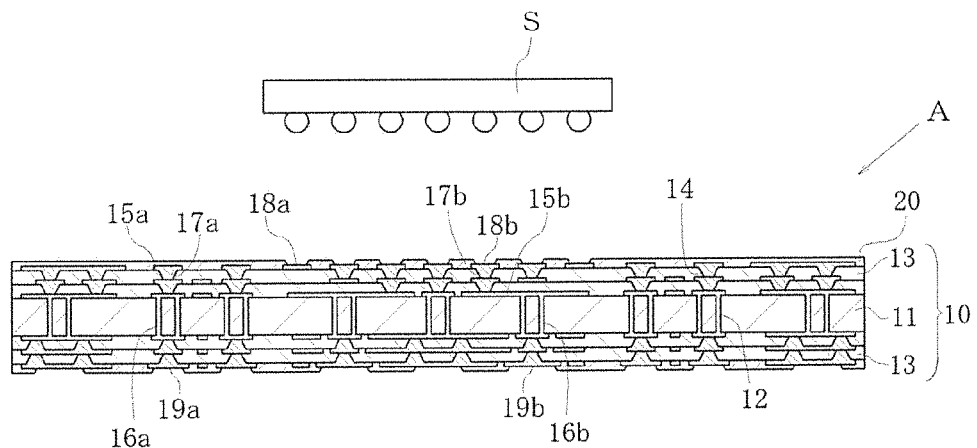
FIG. 1 is a schematic cross-sectional view illustrating a wiring board according to one embodiment of the present invention.

The wiring board according to the one embodiment will be described with reference to FIGS. 1 and 2. The wiring board A shown in FIG. 1 includes the insulating board 10 where a plurality of insulating layers 13 having the via hole 14 are laminated on the upper and lower surfaces of the insulating plate 11 having the through-hole 12.

The insulating plate 11 is a member to be the core board of the wiring board A. The insulating plate 11 is, for example, formed from electrically insulating material where the glass fabric in which a glass fiber bundle is woven in the vertical and horizontal directions is impregnated with a thermosetting resin such as an epoxy resin and a bismaleimide triazine resin. The insulating plate 11 has the thickness of about 0.3 to 1.5 mm. The diameter of the through-hole 12 is about 0.1 to 0.3 mm.

Each of the insulating layers 13 laminated on the upper and lower surfaces of the insulating plate 11 is a build-up insulating layer. The insulating layer 13 is formed from an insulating material where the inorganic insulating filler such as the silicon oxide powder is dispersed about 30 to 70 mass % in the thermosetting resin such as an epoxy resin. Each of the insulating layers 13 has the thickness of about 20 to 60 μm. A plurality of via holes 14 having the diameters of about 30 to 100 μm are formed from the upper surface to the lower surface of each of the insulating layers 13.

A plurality of conductors 15a and 15b are arranged on the surface of and inside the insulating board 10. The conductor 15a is a conductor for a differential signal. The conductor 15b is a conductor for grounding or a power supply. The conductors 15a and 15b are formed from, for example, copper. The conductors 15a and 15b have the thicknesses of about 5 to 50 μm.

Through-conductors 16a and 16b are deposited in the through-hole 12. The through-conductor 16a is a through-conductor for a differential signal. The through-conductor 16b is a through-conductor for grounding or a power supply. The through-conductors 16a and 16b are formed from, for example, copper. The through-conductors 16a and 16b have the thicknesses of about 5 to 25 μm. Resin is filled inside the through-hole 12 where the through-conductors 16a and 16b are deposited.

The via-hole conductors 17a and 17b are filled in the via hole 14. The via-hole conductor 17a is a via-hole conductor for a differential signal. The via-hole conductor 17b is a via-hole conductor for grounding or a power supply. The via-hole conductors 17a and 17b are formed from, for example, copper.

A plurality of semiconductor element connection pads 18a and 18b are formed in the central portion of the upper surface of the insulating board 10. The semiconductor element connection pads 18a and 18b are formed from a part of the conductors 15a and 15b. The semiconductor element connection pads 18a and 18b are formed in a two-dimensional arrangement. The semiconductor element connection pad 18a is a semiconductor element connection pad for a differential signal. The semiconductor element connection pad 18b is a semiconductor element connection pad for grounding or a power supply. The semiconductor element connection pads 18a and 18b are electrically connected to the electrodes of the semiconductor element S through the solder.

The external connection pads 19a and 19b are formed on the lower surface of the insulating board 10. The external connection pads 19a and 19b are formed from a part of the conductors 15a and 15b. The external connection pads 19a and 19b are formed in a two-dimensional arrangement. The external connection pad 19a is an external connection pad for a differential signal. The external connection pad 19b is an external connection pad for grounding or a power supply. The external connection pads 19a and 19b are connected to the wiring conductors of the external electric circuit board through the solder.

Furthermore, a solder resist layer 20 is deposited on the surfaces of the insulating layer 13 and the conductors 15a and 15b of the outermost layer. The solder resist layer 20 on the upper surface side includes the opening exposing the central portion of the semiconductor element connection pads 18a and 18b. The solder resist layer 20 on the lower surface side includes the opening exposing the central portion of the external connection pads 19a and 19b. The solder resist layer 20 is formed from a thermosetting resin such as an acrylic-modified epoxy resin containing, for example, a filler such as silica. The solder resist layer 20 has the thickness of about 10 to 50 μm.

The wiring board A shown in FIG. 1 includes a transmission path for a differential signal and a transmission path for grounding or a power supply. The transmission path for a differential signal connects the semiconductor element connection pad 18a for a differential signal and the external connection pad 19a to each other through the conductor 15a, the through-conductor 16a, and the via-hole conductor 17a. As for the transmission paths for a differential signal, a pair of transmission paths for a differential signal are disposed in such a manner as to be mutually adjacent. The through-conductor 16a and the via-hole conductor 17a are connected to the central portion of the external connection pad 19a for a differential signal. The transmission path for grounding or a power supply connects the semiconductor element connection pad 18b and the external connection pad 19b to each other through the conductor 15b, the through-conductor 16b, and the via-hole conductor 17b.

Figure 2:
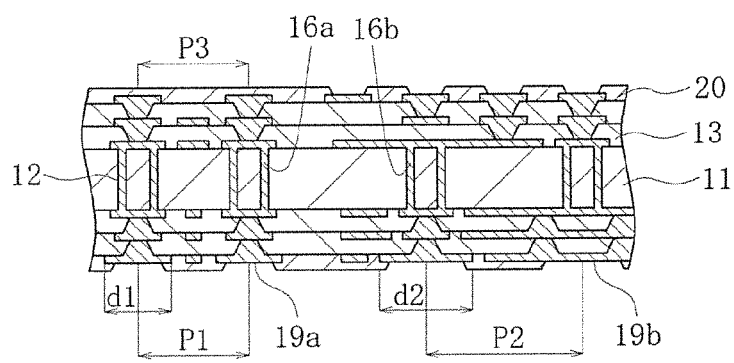
FIG. 2 is a principal part enlarged cross-sectional view of the wiring board shown in FIG. 1.
Figure 3:
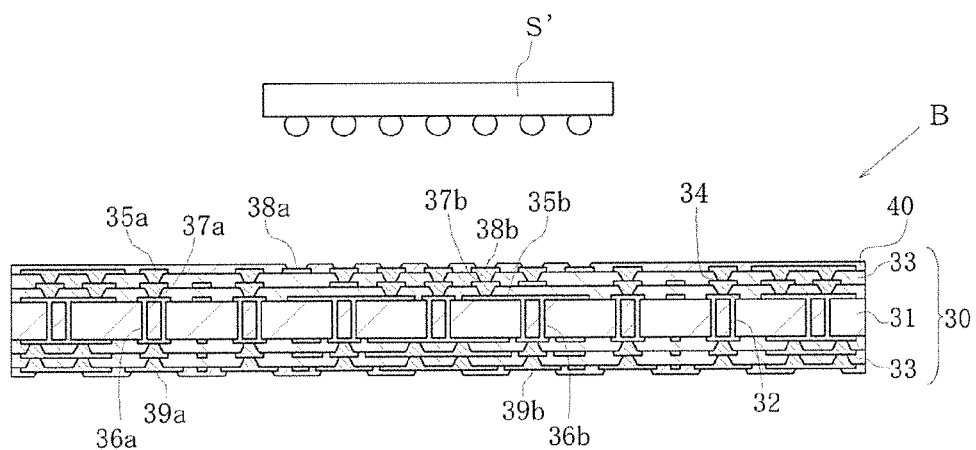
FIG. 3 is a schematic cross-sectional view illustrating a conventional wiring board.

In the wiring board A, as shown in FIG. 2, the diameter d1 and the arrangement pitch P1 of the external connection pad 19a for a differential signal are smaller than the diameter d2 and the arrangement pitch P2 of the external connection pad 19b for grounding or a power supply. Furthermore, the arrangement pitch P3 of the through-conductor 16a connected to the external connection pad 19a for a differential signal is less than or equal to the arrangement pitch P1 of the external connection pad 19a for a differential signal.

The diameter d1 of the external connection pad 19a for a differential signal is preferred to be less than the diameter d2 of the external connection pad 19b for grounding or a power supply by about 100 to 300 µm. The arrangement pitch P1 of the external connection pad 19a for a differential signal is preferred to be less than the arrangement pitch P2 of the external connection pad 19b for grounding or a power supply by about 0.35 to 0.8 mm. Furthermore, the difference between the arrangement pitch P3 of the through-conductor 16a connected to the external connection pad 19a for a differential signal and the arrangement pitch P1 of the external connection pad 19a for a differential signal is about 0 to 0.25 mm.

Specifically, the diameter d1 is about 300 to 500 µm, preferably about 400 µm. The arrangement pitches P1 and P3 are about 0.45 to 0.7 mm, preferably about 0.55 mm. The diameter d2 is about 400 to 800 µm, preferably about 640 µm. The arrangement pitch P2 is about 0.8 to 1.5 mm, preferably about 1 mm.

In the present invention, as described above, the diameter d1 and the arrangement pitch P1 of the external connection pad 19a for a differential signal are formed smaller than the diameter d2 and the arrangement pitch P2 of the external connection pad 19b for grounding or a power supply. For this reason, the electrostatic capacitance between the adjacent external connection pads 19a for a differential signal can be reduced, and the value of the impedance can be increased to be closer to 100Ω. Furthermore, the arrangement pitch P3 of the through-conductor 16a connected to the external connection pad 19a for a differential signal is less than or equal to the arrangement pitch P1 of the external connection pad 19a for a differential signal. For this reason, the electrostatic capacitance between the adjacent through-conductors 16a for a differential signal can be increased, and the value of the impedance can be decreased to be closer to 100Ω.

In addition, the resonance occurs between the external connection pad 19a for a differential signal, the through-conductor 16a connected to the external connection pad 19a for a differential signal, the conductor 15a for a differential signal, the via-hole conductor 17a, and the semiconductor element connection pad 18a; and the reflection of the signal between them can be decreased.

Thereby, the impedance mismatching is reduced, and the reflection of the signal is decreased between the external connection pad 19a for a differential signal and the through-conductor 16a, whereby the wiring board capable of transmitting the high-frequency signal efficiently can be provided. The ratio of the number of the external connection pads 19a for a differential signal to that of the external connection pads 19 is about 10 to 20%. Therefore even when the diameter d1 of the external connection pad 19a for a differential signal is reduced, the impact on the connection reliability between the wiring board and the external electric circuit board is small.

The present invention is not limited to the one embodiment described above, and various modifications are possible as long as they are within the scope of the claims. For example, in the wiring board A according to the one embodiment described above, the arrangement pitch P3 and the arrangement pitch P1 are almost the same pitches. However, it is not particularly limited as long as the arrangement pitch P3 is equal to or less than the arrangement pitch P1.

In the wiring board A according to the one embodiment described above, the insulating board 10 is formed by an insulating plate 11 and insulating layer 13, two layers of which are laminated on each of the upper and lower surfaces of the insulating plate 11. However, the number of layers of the insulating layers 13 laminated on the upper and lower surfaces of the insulating plate 11 is not limited, and the number of layers may be different depending on the upper and lower surfaces of the insulating plate 11.

In the wiring board A according to the one embodiment described above, the through-hole 12 includes the through-conductors 16a and 16b deposited on the wall surface, and the resin filled inside. However, the through-conductor 16a and 16b may be filled in the through-hole 12.

What is claimed is:

1. A wiring board comprising:
   an insulating board;
   at least a pair of mutually adjacent external connection pads for a differential signal and a plurality of external connection pads for grounding or a power supply formed on a lower surface of the insulating board; and
   a through-conductor formed in the insulating board, the through-conductor electrically connected to each of the external connection pads,
   wherein each of the external connection pads is formed in a two-dimensional arrangement,
   wherein a diameter and an arrangement pitch of the external connection pad for a differential signal are smaller than a diameter and an arrangement pitch of the external connection pad for grounding or a power supply, and
   wherein an arrangement pitch of the through-conductor connected to the external connection pad for a differential signal is less than or equal to an arrangement pitch of the external connection pad for a differential signal.

2. The wiring board according to claim 1, wherein the insulating board is formed by an insulating plate, and at least one insulating layer laminated on each of an upper surface and a lower surface of the insulating plate.

3. The wiring board according to claim 1, wherein a diameter of the external connection pad for a differential signal is less than a diameter of the external connection pad for grounding or a power supply by 100 to 300 µm.

4. The wiring board according to claim 1, wherein an arrangement pitch of the external connection pad for a differential signal is less than an arrangement pitch of the external connection pad for grounding or a power supply by 0.35 to 0.8 mm.

5. The wiring board according to claim 1, wherein a difference between an arrangement pitch of the through-conductor connected to the external connection pad for a differential signal and an arrangement pitch of the external connection pad for a differential signal is 0 to 0.25 mm.

* * * * *